(12) United States Patent
Kim et al.

(10) Patent No.: US 9,923,026 B2
(45) Date of Patent: Mar. 20, 2018

(54) ELECTRONIC DEVICE INCLUDING A SEMICONDUCTOR MEMORY HAVING A BARRIER LAYER

(71) Applicant: SK hynix Inc., Icheon-Si (KR)

(72) Inventors: Yu-Jin Kim, Icheon-si (KR); Sung-Woong Chung, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 132 days.

(21) Appl. No.: 14/863,978

(22) Filed: Sep. 24, 2015

(65) Prior Publication Data

US 2016/0308114 A1 Oct. 20, 2016

(30) Foreign Application Priority Data

Apr. 14, 2015 (KR) .................. 10-2015-0052552

(51) Int. Cl.
*G11C 11/00* (2006.01)
*H01L 27/22* (2006.01)
(Continued)

(52) U.S. Cl.
CPC .......... *H01L 27/228* (2013.01); *G06F 3/0604* (2013.01); *G06F 3/0629* (2013.01); *G06F 3/0679* (2013.01); *G06F 12/0802* (2013.01); *G06F 13/4068* (2013.01); *G11C 11/1659* (2013.01); *G11C 11/1673* (2013.01); *G11C 13/003* (2013.01); *G11C 13/004* (2013.01); *H01L 27/224* (2013.01); *H01L 27/2418* (2013.01); *H01L 27/2427* (2013.01); *H01L 27/2436* (2013.01); *H01L 45/00* (2013.01); *H01L 45/04* (2013.01); *H01L 45/1233* (2013.01); *H01L 45/146* (2013.01); *G06F 2212/222* (2013.01); *G11C 13/0004* (2013.01); *G11C 13/0007* (2013.01); *G11C 2213/74* (2013.01); *G11C 2213/76* (2013.01); *G11C 2213/79* (2013.01)

(58) Field of Classification Search
CPC .......................... H01L 27/228; G06F 3/0604
USPC .................. 365/148, 153, 157, 163
See application file for complete search history.

(56) References Cited

U.S. PATENT DOCUMENTS

| | | | | |
|---|---|---|---|---|
| 8,969,843 | B2 * | 3/2015 | Ohba | ............... H01L 45/12 257/2 |
| 2012/0025164 | A1 * | 2/2012 | Deweerd | ........... G11C 13/0004 257/5 |

(Continued)

FOREIGN PATENT DOCUMENTS

KR 10-2010-0027184 A 3/2010

*Primary Examiner* — Vu Le
(74) *Attorney, Agent, or Firm* — Perkins Coie LLP

(57) ABSTRACT

Provided an electronic device including a semiconductor memory. The semiconductor memory may include: a selecting element; a variable resistance element electrically coupled to the selecting element through a first conductive plug; a first line electrically coupled to the variable resistance element through a second conductive plug; a second line electrically coupled to the selecting element through a third conductive plug; and one or more barrier layers arranged to form one or more electrical connections with the variable resistance element or the selecting element or the both and operated as an insulator or conductor according to a resistance state of the variable resistance element during a read operation.

19 Claims, 9 Drawing Sheets

(51) Int. Cl.

| | |
|---|---|
| *G11C 11/16* | (2006.01) |
| *G06F 3/06* | (2006.01) |
| *G06F 12/0802* | (2016.01) |
| *G06F 13/40* | (2006.01) |
| *H01L 45/00* | (2006.01) |
| *H01L 27/24* | (2006.01) |
| *G11C 13/00* | (2006.01) |

(56) References Cited

U.S. PATENT DOCUMENTS

| | | | |
|---|---|---|---|
| 2012/0313069 A1* | 12/2012 | Wang | H01L 45/04 257/4 |
| 2014/0145140 A1* | 5/2014 | Kim | H01L 45/06 257/4 |
| 2016/0155503 A1* | 6/2016 | Yoon | G11C 13/0069 711/102 |

* cited by examiner

ELECTRONIC DEVICE INCLUDING A SEMICONDUCTOR MEMORY HAVING A BARRIER LAYER

CROSS-REFERENCE TO RELATED APPLICATIONS

This patent document claims priority of Korean Patent Application No. 10-2015-0052552, entitled "ELECTRONIC DEVICE" and filed on Apr. 14, 2015, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which includes a semiconductor memory capable of securing a read margin even though a resistance difference of a variable resistance element is small.

In one aspect, there is provided an electronic device including a semiconductor memory. The semiconductor memory may include: a selecting element; a variable resistance element electrically coupled to the selecting element through a first conductive plug; a first line electrically coupled to the variable resistance element through a second conductive plug; a second line electrically coupled to the selecting element through a third conductive plug; and one or more barrier layers arranged to form one or more electrical connections with the variable resistance element or the selecting element or the both and operated as an insulator or conductor according to a resistance state of the variable resistance element during a read operation.

Implementations of the above electronic device may include one or more the following.

The one or more connections are formed at one or more locations including an interface between the first conductive plug and the selecting element, an inside of the first conductive plug, an interface between the first conductive plug and the variable resistance element, an interface between the second conductive plug and the variable resistance element, an inside of the second conductive plug, an interface between the second conductive plug and the first line, an interface between the third conductive plug and the selecting element, an inside of the third conductive plug, or an interface between the third conductive plug and the second line. When the variable resistance element has a high resistance state, the one or more barrier layers function as an insulator, and when the variable resistance element has a low resistance state, the one or more barrier layers function as a conductor. The one or more barrier layers have a single-layer structure or multilayer structure including an OTS (Ovonic Threshold Switching) material, an MIEC (Mixed Ionic Electronic Conducting) material, an MIT (Metal Insulator Transition) material, a tunneling insulator, or a semiconductor material. The one or more barrier layers in contact with the first conductive plug has a width equal to or greater than a width of the first conductive plug while overlapping the first conductive plug. The one or more barrier layers in contact with the second conductive plug has a width equal to or greater than a width of the second conductive plug while overlapping the second conductive plug. The one or more barrier layers in contact with the third conductive plug has a width equal to or greater than a width of the third conductive plug while overlapping the third conductive plug. The variable resistance element has a structure in which a tunnel barrier layer is interposed between two magnetic layers. The selecting element includes a transistor having a gate electrode, a first junction region positioned at one side of the gate electrode and coupled to the first conductive plug, and a second junction region positioned at the other side of the gate electrode and coupled to the third conductive plug. The one or more barrier layer have a sidewall aligned with sidewalls of one or more of the first to third conductive plugs. The one or more barrier layers have a sidewall aligned with a sidewall of the variable resistance element. The one or more barrier layers have a sidewall aligned with sidewalls of one or more of the first and second lines.

In another aspect, there is provided an electronic device including a semiconductor memory. The semiconductor memory may include: a memory cell including a variable resistance element and a selecting element coupled to the variable resistance element; a first line coupled to the variable resistance element of the memory cell; a second line coupled to the selecting element of the memory cell; and one or more barrier elements coupled to the selecting element or the variable resistance element or the both and configured to increase a read margin of the memory cell as compared to a memory cell with no barrier element during a read operation.

Implementations of the above electronic device may include one or more the following.

The one or more barrier elements are positioned at one or more locations including a portion from the variable resistance element to the selecting element, a portion from the variable resistance element to the first line, or a portion from the selecting element to the second line, and the one or more barrier elements are configured to be selectively turned on or off according to a resistance state of the variable resistance element. When the variable resistance element has a high resistance state, the one or more barrier elements are turned off, and when the variable resistance element has a low resistance state, the one or more barrier elements are turned on. The variable resistance element includes an MTJ (Magnetic Tunnel Junction) element. The one or more barrier elements include an OTS material, an MIEC material, an MIT material, a tunneling insulator, or a semiconductor material.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

These and other aspects, implementations and associated advantages are described in greater detail in the drawings, the description and the claims.

DETAILED DESCRIPTION

Figure 1:
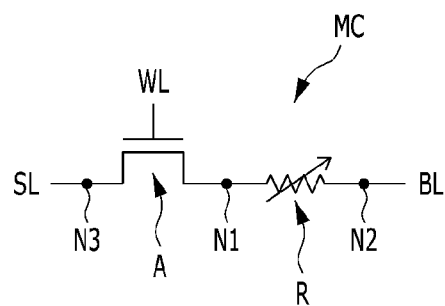
FIG. 1 is a diagram illustrating an exemplary memory cell in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a diagram illustrating a memory cell in accordance with an implementation.

Referring to FIG. 1, the memory cell MC in accordance with the implementation may include a variable resistance element R and a selecting element A. The variable resistance element R may have different resistance states to store different data, and the selecting element A may control an access to the variable resistance element R.

The variable resistance element R may switch between different resistance states according to a current or voltage supplied across the variable resistance element R, that is, a current or voltage supplied through a bit line BL and a source line SL. The variable resistance element R may have a single-layer or multilayer structure including various materials used for RRAM, PRAM, FRAM, or MRAM and the like. For example, the various materials may include a transition metal oxide, a metal oxide such as a perovskite-based material, a phase change material such as a chalcogenide-based material, a ferrodielectric material, or a ferromagnetic material. One end of the variable resistance element R may be coupled to the selecting element A, and the other end of the variable resistance element R may be coupled to the bit line BL.

The selecting element A may have one end coupled to the variable resistance element R and the other end coupled to the source line SL, and control whether to transmit a current or voltage supplied from the source line SL to the variable resistance element R. In the present implementation, the selecting element A may be implemented with a transistor having three terminals, that is, a gate, a source, and a drain. In this case, the drain of the transistor may be coupled to the variable resistance element R, the source may be coupled to the source line SL, and the gate may be coupled to a word line WL. However, the present implementation is not limited thereto. The selecting element A may include various elements, for example, a diode or the like, which have the same or similar characteristic to the transistor.

A barrier element may be positioned at one or more locations including a first node N1 between the variable resistance element R and the selecting element A, a second node N2 between the variable resistance element R and the bit line BL, and a third node N3 between the selecting element A and the source line SL. The barrier element may be selectively turned on or off according to the magnitude of a voltage or current applied across the barrier element. When the magnitude of the voltage or current applied across the barrier element is equal to or less than a predetermined threshold value, the barrier element may have a turn-off state, that is, a high-resistance state. On the other hand, when the magnitude of the voltage or current applied across the barrier element is greater than the predetermined threshold value, the barrier element may be turned on and operated as if the barrier element does not exist.

The barrier element may have a single-layer or multilayer structure including an OTS (Ovonic Threshold Switching) material such as a chalcogenide-based material, an MIEC (Mixed Ionic Electronic Conducting) material such as a metal-containing chalcogenide-based material, an MIT (Metal Insulator Transition) material such as $NbO_2$ or $VO_2$, a tunneling insulator, or a semiconductor material such as polysilicon. The OTS material, the MIEC material, the MIT material, and the semiconductor material may have an insulating characteristic or conducting characteristic according to a voltage or current applied thereto. The tunneling insulator may enable an electron tunneling according to a voltage or current applied to the tunneling insulator. The tunneling insulator may include a general insulating material such as SiN or $SiO_2$ or a metal oxide such as $TiO_2$ or $Ta_2O_5$. The metal oxide has a much smaller energy bandgap than the general insulating material. For the case of using the general insulating material, The electron tunneling can occur by adjusting the thickness of the tunneling insulator to be small enough.

During a read operation of the memory cell MC, a constant magnitude of read voltage may be applied across the memory cell MC. At this time, when the variable resistance element R has a high-resistance state, most of the read voltage may be applied to the variable resistance element R. Thus, a voltage applied to the other region, for example, a source-drain voltage Vds of the selecting element A becomes small. Thus, when the barrier elements of the first to third nodes N1 to N3 are turned off and have a high-resistance state, the resistance of the memory cell MC, measured during the read operation, may correspond to a value obtained by adding the resistance (high resistance) of the variable resistance element R and the resistances of the barrier elements. On the other hand, when the variable resistance element R has a low resistance state, a relatively high voltage may be applied to the other region so as to turn on the barrier elements. In this case, the barrier element may be operated as if the barrier element does not exist. Thus, the resistance of the memory cell MC, measured during the read operation, may correspond to the resistance (low resistance) of the variable resistance element R.

For such a read operation, the barrier element in accordance with the present implementation may be configured to be selectively turned on or off according to the resistance state of the variable resistance element R, when a read voltage is applied to the memory cell MC. For example, during the read operation, the barrier element may be turned off when the variable resistance element R has a high resistance state, and turned on when the variable resistance element R has a low resistance state. For this operation, the barrier element can be configured in various manners. For example, a material, layer structure, thickness, number, and positions of the barrier elements can be adjusted.

In accordance with the present implementation, the memory cell can have an improved read margin as compared to the conventional memory cell which includes no barrier elements. Specifically, when no barrier element exists as in the conventional memory cell, the resistance of the memory cell may directly correspond to the resistance of the variable resistance element. That is because resistances of the other elements of the memory cell are almost constant. Thus, the read margin of the memory cell may be determined according to a difference between high resistance and low resistance of the variable resistance element. Therefore, a variable resistance element such as MTJ (Magnetic Tunnel Junction), which has a relatively small difference between high resistance and low resistance, may exhibit an insufficient read margin. However, when the barrier element is introduced to the memory cell as described in the present implementation, the resistance of the memory cell is determined by reflecting the resistance of the barrier element as well as the variable resistance element. That is because the resistances of the barrier element changes according to the resistance state of the variable resistance element. In this case, the read margin of the memory cell depends on a difference between the sum of high resistance of the variable resistance element and the resistance of the barrier element and low resistance of the variable resistance element (in the low resistance state, the resistance of the barrier element can be ignored since the barrier element is operated as if the barrier element does not exist). Accordingly, when the variable resistance element has high resistance, the memory cell in accordance with the present implementation may have resistance increased by the resistance of the barrier element, compared to the conventional memory cell. As a result, the read margin can be improved. This can be verified as illustrated in FIGS. 2 and 3.

Figure 2:
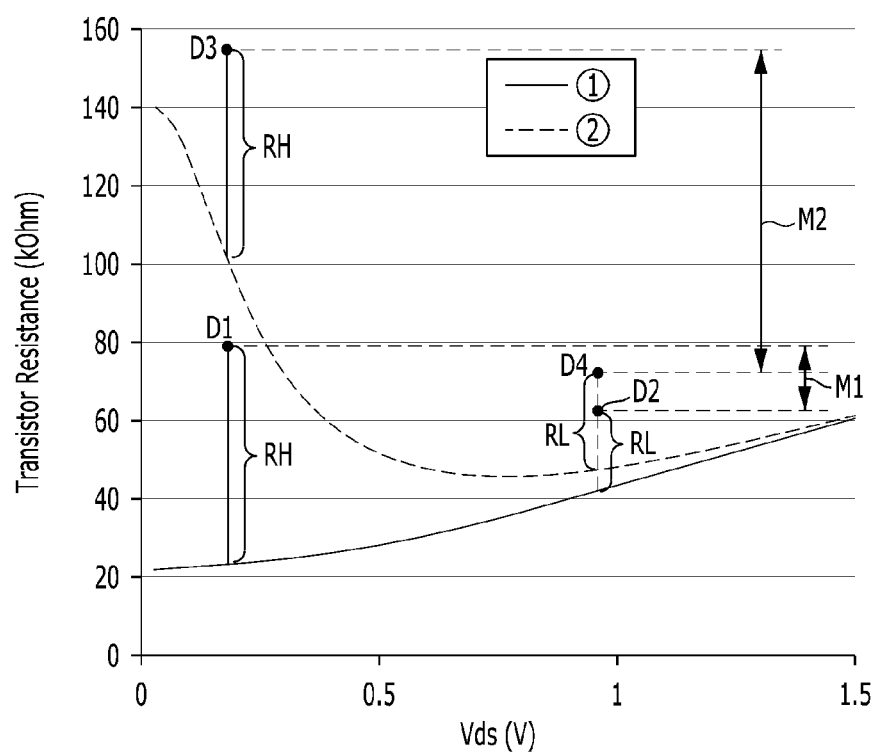
FIG. 2 is a graph showing a relationship between voltage applied to a transistor and resistance of the transistor.
Figure 3:
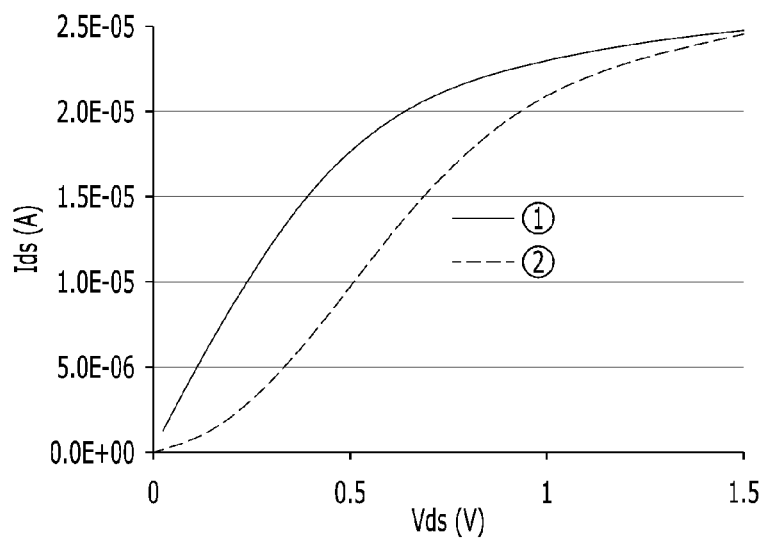
FIG. 3 is a graph showing a relationship between voltage applied to a transistor and current of the transistor.

FIGS. 2 and 3 illustrate the case in which a transistor is used as the selecting element A. FIG. 2 is a voltage-resistance graph of the transistor, and FIG. 3 is a voltage-current graph of the transistor. Specifically, curves ① of FIGS. 2 and 3 indicate resistance and source-drain current Ids based on the source-drain voltage Vds of a transistor when no barrier element exists as in the conventional memory cell (hereafter, the transistor with no barrier element is referred to as a first transistor), and curves ② of FIGS. 2 and 3 indicate resistance and source-drain current Ids based on the source-drain voltage Vds of a transistor when a barrier element exist as in the memory cell in accordance with the present implementation (hereinafter, the transistor with the barrier element is referred to as a second transistor).

Referring to the curves ① and ② of FIGS. 2 and 3, the second transistor may have resistance which rapidly decreases according to the increase of a voltage, while having very large resistance at a relatively low voltage section, for example, a voltage section of 0.5V or less. That is because the barrier element is turned off when the voltage is less than a predetermined threshold voltage, but turned on when the voltage exceeds the predetermined threshold voltage. On the other hand, the resistance of the first transistor may slightly increase according to the voltage increase and have a gentle slope, since no barrier element exists.

Suppose that the variable resistance element has high and low resistance values RH and LH when the variable resistance element has a high resistance state and low resistance state, respectively. In this case, a first dot D1 corresponds to the sum of resistance of the first transistor and high resistance value RH of the variable resistance element, a second dot D2 corresponds to the sum of resistance of the first transistor and low resistance value RL of the variable resistance element, a third dot D3 corresponds to the sum of resistance of the second transistor and high resistance value RH of the variable resistance element, and a fourth dot D4 corresponds to the sum of resistance of the second transistor and low resistance value RL of the variable resistance element.

The read operation of the memory cell including the first transistor and the variable resistance element is performed by reading a difference in resistance, M1, between the first dot D1 and the second dot D2. Since the transistor resistance is almost constant or slightly changes with the change of the resistance state of the variable resistance element, the difference between high resistance value RH and the low resistance value RL of the variable resistance element substantially affects to the read operation of the memory cell.

The read operation of the memory cell including the second transistor and the variable resistance element is performed by reading a difference in resistance, M2, between the third dot D3 and the fourth dot D4. The resistance of the second transistor significantly changes depending on the resistance state of the variable resistance element. When the variable resistance element has high resistance, the resistance of the second transistor becomes relatively or very large because a relatively or very small voltage is applied to the second transistor. On the other hand, when the variable resistance element has low resistance, the resistance of the second transistor becomes relatively or very small because a relatively or very large voltage is applied to the second transistor. Thus, for performing the read operation of the memory cell, a difference between the sum of high resistance of the second transistor and high resistance value RH of the variable resistance element and the sum of low resistance of the second transistor and the low resistance value RL of variable resistance element needs to be read. Compared to the case of the first transistor, the second transistor has greater resistance when the variable resistance element has high resistance. In some implementations, the increase of resistance of the second transistor can be significant. The read margin can be increased as much as the increase of the resistance of the second transistor in the high resistance state.

Figure 4A:
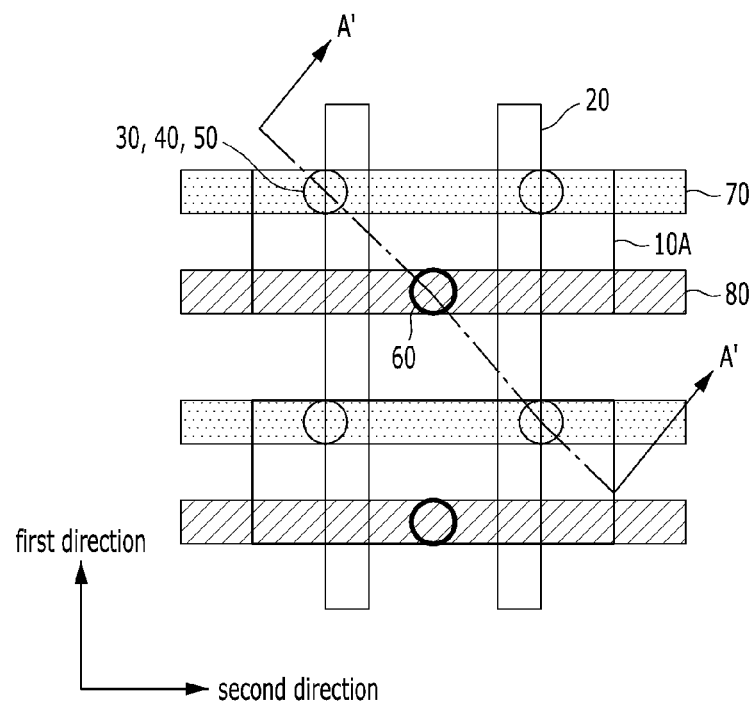
FIGS. 4A and 4B are diagrams illustrating an example of a semiconductor device which includes an array including the memory cell illustrated in FIG. 1.
Figure 4B:
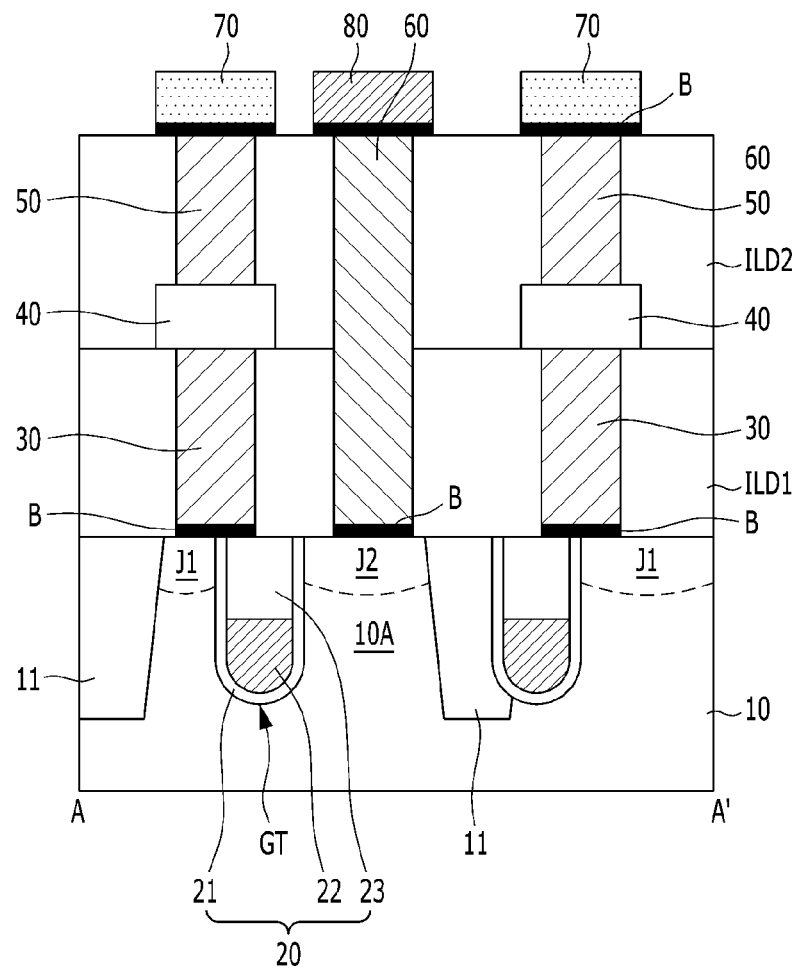

FIGS. 4A and 4B are diagrams illustrating an example of a semiconductor device which includes an array including the memory cell illustrated in FIG. 1. FIG. 4A is a plan view, and FIG. 4B is a cross-sectional view taken along A-A' line of FIG. 4A.

Referring to FIGS. 4A and 4B, the semiconductor device in accordance with the implementation may include a substrate 10, a gate structure 20, first and second junction regions J1 and J2, a variable resistance element 40, a first line 70, a second line 80, and barrier layers B. The semiconductor substrate 10 may have a plurality of active regions 10A defined by an isolation layer 11. The gate structure 20 may be extended in a first direction so as to cross the active regions 10A arranged in the first direction. The first and second junction regions J1 and J2 may be formed in the active regions 10A at both sides of the gate structure 20. The bottom of the variable resistance element 40 may be coupled to the first junction region J1 through a first conductive plug 30. The first line 70 may be coupled to the top of the variable resistance element 40 through a second conductive plug 50. The second line 80 may be coupled to the second junction region J2 through a third conductive plug 60. The barrier layers B may be interposed at one or more locations including between the first junction region J1 and the first conductive plug 30, between the second conductive plug 50 and the first line 70, between the second junction region J2 and the third conductive plug 60, or between the third conductive plug 60 and the second line 80, respectively.

The active region 10A may be formed in a bar shape and have a minor axis in the first direction and a major axis in the second direction. FIG. 4A illustrates only two active regions 10A arranged in the first direction. However, the plurality of active regions 10A may be arranged in a matrix type along the first and second directions.

As the gate structure 20 is formed in a gate trench GT formed by etching the semiconductor substrate 10, the gate structure 20 may be buried in the semiconductor substrate 10. The gate structure 20 may include a gate dielectric layer 21, a gate electrode 22, and a gate passivation layer 23. The gate dielectric layer 21 may be formed along the inner wall of the gate trench GT. The gate electrode 22 may be buried at the bottom of the gate trench GT having the gate dielectric layer 21 formed therein. The gate passivation layer 23 may be buried in the rest of the gate trench GT in which the gate dielectric layer 21 and the gate electrode 22 are formed. In some implementations, a part or all of the gate electrode 22 may have a shape protruding from the semiconductor substrate 10. In the present implementation, two gate structures 20 may cross one active region 10A.

The first and second junction regions J1 and J2 are provided at sides of the gate structure 20. In some implementations, the first junction region J1 may be or include a drain region, and the second junction region J2 may be or include a source region. However, other implementations are also possible. For example, the first junction region J1 may be or include the source region, and the second junction region J2 may be or include the drain region. One gate structure 20 overlapping one active region 10A forms one transistor together with the first and second junction regions J1 and J2 at both sides of the gate structure 20. In the present implementation, two transistors adjacent to each other in the second direction may be formed in one active region 10. In the active region 10A between the two gate structures 20 adjacent in the second direction, the second junction region J2 may be formed and shared by two transistors. Furthermore, the first junction region J1 may be formed at both sides of the two gate structures 20 in each of the active regions 10A.

The first conductive plug 30 may be formed over the first junction region J1 so as to overlap the first junction region J1, and arranged close to one side of the active region 10A in the first direction, for example, the top side in FIG. 4A. This arrangement enables to secure an interval between the first and second lines 70 and 80 when the first and second lines 70 and 80 are formed at the same layer.

The variable resistance element 40 may be formed over the first conductive plug 30 so as to overlap the first conductive plug 30. The variable resistance element 40 may switch between different resistance states according to a current or voltage supplied through the top and bottom thereof. The variable resistance element 40 may have a single-layer or multilayer structure including various materials used for RRAM, PRAM, FRAM, or MRAM and the like. For example, the various materials may include a transition metal oxide, a metal oxide such as a perovskite-based material, a phase change material such as a chalcogenide-based material, a ferrodielectric material, or a ferromagnetic material. In the present implementation, the variable resistance element 40 may have a structure illustrated in FIG. 4C.

Figure 4C:
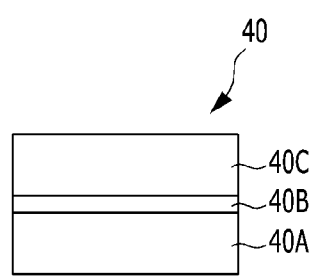
FIG. 4C is a diagram illustrating an example of a variable resistance element of FIG. 4A or 4B.

FIG. 4C is a diagram illustrating an example of the variable resistance element 40 of FIGS. 4A and 4B.

Referring to FIG. 4C, the variable resistance element 40 may have an MTJ (Magnetic Tunnel Junction) structure including a bottom magnetic layer 40A, a top magnetic layer 40C, and a tunneling dielectric layer 40B interposed between the bottom magnetic layer 40A and the top magnetic layer 40C. According to the parallel/anti-parallel state of the magnetization direction of the bottom and top magnetic layers 40A and 40C, the variable resistance element 40 may have different resistance states. Since the MTJ structure has a small difference between high resistance and low resistance, the MTJ structure may exhibit an insufficient read margin. Thus, when the MTJ structure is used as the variable resistance element 40, the barrier layers B in accordance with the implementation may be used to increase the read margin.

Referring back to FIGS. 4A and 4B, the second conductive plug 50 may be formed over the variable resistance element 40 so as to overlap the variable resistance element 40.

The first line 70 may be extended in the second direction over the second conductive plug 50 while overlapping the second conductive plug 50 arranged in the second direction. The first line 70 may include a bit line.

The third conductive plug 60 may be formed over the second junction region J2 so as to overlap the second junction region J2, and arranged close to the other side of the active region 10A in the first direction, for example, the bottom side in FIG. 4A. This arrangement enables to secure an interval between the first and second lines 70 and 80 when the first and second lines 70 and 80 are formed at the same layer. The top surface of the third conductive plug 60 may have substantially the same level as the top surface of the second conductive plug 50.

The second line 80 may be extended in the second direction over the third conductive plug 60 while overlapping the third conductive plug 60 arranged in the second direction. The second line 80 may include a source line. The second line 80 may be positioned at the same level as the first line 70 in the vertical direction. Even in this case, the arrangement of the conductive plugs 30, 50, and 60 can help the second line 80 to secure the interval from the first line 70 in the first direction.

The barrier layer B may operate to selectively pass a current. In particular, during a read operation, the barrier layer B may pass a current or block a current according to the resistance state of the variable resistance element. When the barrier layer B passes a current, the barrier layer B can function as a conductor, and when the barrier layer B blocks a current, the barrier layer B can function as an insulator. For example, when the variable resistance element 40 has a high-resistance state in case where a read voltage is applied through the first and second lines 70 and 80 for a read operation, the barrier layer B may have a high-resistance state and function as an insulator. On the other hand, when the variable resistance element 40 has a low-resistance state in case where the read voltage is applied, the barrier layer B may have a low-resistance state and function as a conductor. The barrier layer B may have a single-layer or multilayer structure including an OTS material, an MIEC material, an MIT material, a tunneling insulator, or a semiconductor material.

In the present implementation, the barrier layers B has been described to be interposed between the first junction region J1 and the first conductive plug 30, between the second conductive plug 50 and the first line 70, between the second junction region J2 and the third conductive plug 60, and between the third conductive plug 60 and the second line 80. Furthermore, the barrier layers B between the first junction region J1 and the first conductive plug 30 and between the second junction region J2 and the third conductive plug 60 have been described to have sidewalls aligned with the first conductive plug 30 and the third conductive plug 60. Further, the barrier layers B between the second conductive plug 50 and the first line 70 and between the third conductive plug 60 and the second line 80 have been described to have sidewalls aligned with the first line 70 and the second line 80. However, the number, positions, and shapes of the barrier layers B may be modified in various manners. In some implementations, a barrier layer B may exist at only one position among the first to third nodes N1 to N3 in FIG. 1. In some implementations, barrier layers B may exist at positions each corresponding to any of the first to third nodes N1 to N3 in FIG. 1. This will be described with reference to FIGS. 5A through 5C.

Hereafter, a method for fabricating the semiconductor device of FIGS. 4A and 4B will be described.

First, an isolation layer 11 defining active regions 10A in a semiconductor substrate 10 may be formed, and the active regions 10A and the isolation layer 11 may be selectively etched to a gate trench GT which crosses the active regions 10A while extending in the first direction.

A gate dielectric layer 21 may be formed on the inner wall of the gate trench GT through a thermal oxidation process, and the bottom of the gate trench GT may be filled with a conductive material to form a gate electrode 22. Then, the remaining portion of the gate trench GT is filled with an insulating material to from a gate passivation layer 23 covering the gate electrode 22. By performing the series of processes, a gate structure 20 is formed to include the gate dielectric layer, the gate electrode 22 and the gate passivation layer 23.

An ion implantation process or the like may be performed at both sides of the gate structure 20 in the active regions 10A, thereby forming first and second junction regions J1 and J2.

A first interlayer dielectric layer ILD1 may be formed to cover the resultant structure in which the gate structure 20 and the first and second junction regions J1 and J2 are formed. Then, the first interlayer dielectric layer ILD1 is selectively etched to form a hole which exposes the first junction region J1. A barrier layer B may be formed at the bottom surface or portion of the hole, and the remaining portion of the hole may be filled with a conductive material to form a first conductive plug 30.

A variable resistance material may be deposited on the first interlayer dielectric layer ILD1, and then patterned to form a variable resistance element 40 overlapping the first conductive plug 30.

A second interlayer dielectric layer ILD2 may be formed to cover the resultant structure in which the variable resistance element 40 is formed. Then, the second interlayer dielectric layer ILD2 may be selectively etched to form a hole which exposes the top surface of the variable resistance element 40. The hole may be filled with a conductive material to form a second conductive plug 50. Furthermore, the second and first interlayer dielectric layers ILD2 and ILD2 may be selectively etched to form a hole which exposes the second junction region J2, a barrier layer B may be formed at the bottom surface or portion of the hole, and the remaining portion of the hole may be filled with a conductive material to form a third conductive plug 60.

A barrier material and a conductive material may be deposited on the resultant structure in which the second and third conductive plugs 50 and 60 are formed. The deposited barrier material and conductive material may be patterned to form a stacked structure of a barrier layer B and a first line 70 and a stacked structure of a barrier layer B and a second line 80. The stacked structure of the barrier layer B and the first line 70 may be extended in the second direction while overlapping the second conductive plug 50, and the stacked structure of the barrier layer B and the second line 80 may be extended in the second direction while overlapping the third conductive plug 60.

The above-described fabrication method may be modified in various manners. For example, the positions and shape of the barrier layers B may be modified in various manners depending on the process.

Figure 5A:
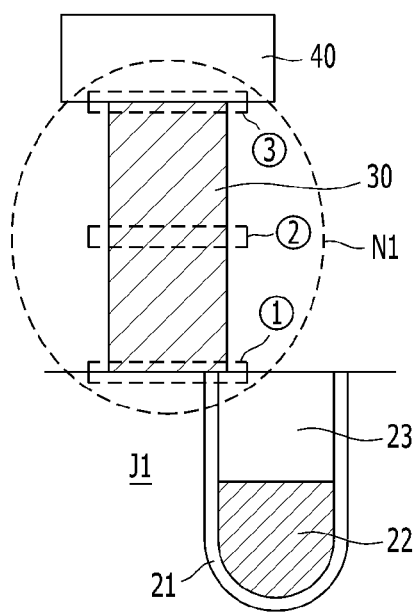
FIGS. 5A through 5C are diagrams for illustrating exemplary positions for a barrier layer of FIG. 4A or 4B.
Figure 5B:
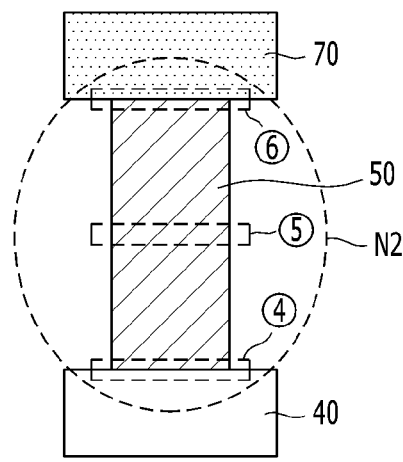
Figure 5C:
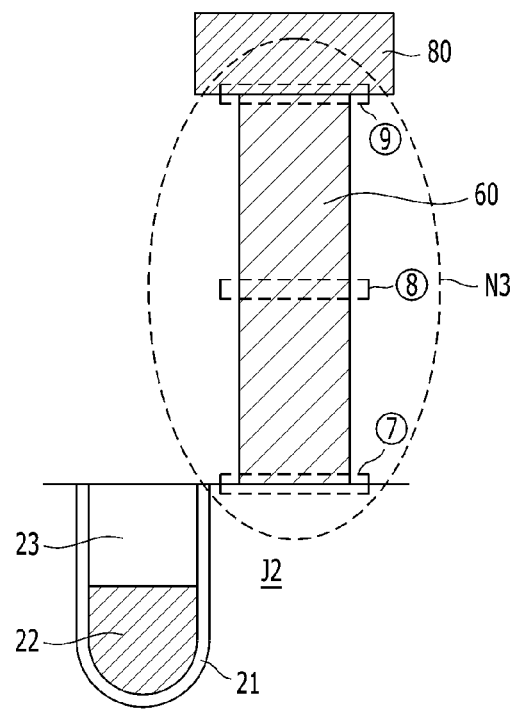

FIGS. 5A to 5C are diagrams for describing a position of a barrier layer in an exemplary semiconductor device. FIG. 5A is an expanded view of a region corresponding to the first node of FIG. 1, FIG. 5B is an expanded view of a region corresponding to the second node of FIG. 1, and FIG. 5C is an expanded view of a region corresponding to the third node of FIG. 1.

In FIG. 1, the first node N1 is between the variable resistance element R and the selecting element A. In FIG. 5A, the first node N1 may correspond to a portion covering from the interface indicated by ① between the first junction region J1 and the first conductive plug 30 to the interface indicated by ③ between the first conductive plug 30 and the variable resistance element 40 (refer to). One or more barrier layers B may be formed in any regions of the first node N. For example, the barrier layer B may be inserted into the interface between the first junction region J1 and the bottom of the first conductive plug 30, the interface between the top of the first conductive plug 30 and the variable resistance element 40, and/or the first conductive plug 30, for example, the middle of the first conductive plug 30 (indicated by ②). The barrier layer B may have various planar shapes depending on process. In some implementations, the barrier layer B has a width equal to or greater than the width of the first conductive plug 30 while overlapping the first conductive plug 30. The barrier layer B can selectively block a current flowing through the first conductive plug 30. For example, when the barrier layer B is positioned at the interface between the first junction region J1 and the bottom of the first conductive plug 30, the barrier layer B may have a planar shape covering the surface of the semiconductor substrate 10 or have sidewalls aligned with the first conductive plug 30 as illustrated in FIG. 4B. When the barrier layer B is positioned at any region of the first conductive plug 30, the barrier layer B may have a planar shape covering the surface of the semiconductor substrate 10, or have sidewalls aligned with the first conductive plug 30. When the barrier layer B is positioned at the interface between the top of the first conductive plug 30 and the variable resistance element 40, the barrier layer B may have a planar shape covering the surface of the semiconductor substrate 10, or have sidewalls aligned with the first conductive plug 30 or the variable resistance element 40.

In FIG. 1, the second node N2 is between the variable resistance element R and the bit line BL. Referring to FIG. 5B, the second node N2 may correspond to a portion covering from the interface indicated by ④ between the variable resistance element 40 and the second conductive plug 50 to the interface indicated by ⑥ between the second conductive plug 50 and the first line 70. In some implementations, the barrier layer B may be positioned at the interfaces between the variable resistance element 40 and the second conductive plug 50 and/or between the second conductive plug 50 and the first line 70. In some implementations, one or more barrier layers B may be formed in any regions of the second node N2. For example, the barrier layer B may be positioned in the middle of the second conductive plug 50 as indicated by ⑤. In some implementations, the barrier layer B may be positioned at the interfaces and in the second conductive plug 50 at the same time. The barrier layer B may have various planar shapes depending on a process. In some implementations, the barrier layer B has a width equal to or greater than the width of the second conductive plug 50 while overlapping the second conductive plug 50. For example, the barrier layer B may have a planar shape of covering the surface of the semiconductor substrate 10. In some implementations, the barrier layer B has sidewalls aligned with the second conductive plug 50, the variable resistance element 40, or the first line 70 as illustrated in FIG. 4B.

In FIG. 1, the third node N3 is between the selecting element A and the source line SL. Referring to FIG. 5C, the third node N3 may correspond to a portion covering from the interface indicated by ⑦ between the second junction region J2 and the third conductive plug 60 to the interface indicated by ⑨ between the third conductive plug 60 and the second line 80. In some implementations, the barrier layer B may be positioned at the interfaces between the second junction region J2 and the third conductive plug 60 and/or between the third conductive plug 60 and the second line 80. In some implementations, one or more barrier layers B may be formed in any regions of the third node N3. For example, the barrier layer B may be positioned in the middle of the third conductive plug 60 as indicated by ⑧. In some implementations, the barrier layer B may be positioned at the interfaces and in the second conductive plug 50 at the same time. For example, the barrier layer B may have a planar shape covering the surface of the semiconductor substrate 10. In some implementations, the barrier layer B may have sidewalls aligned with the third conductive plug 60 or the second line 80 as illustrated in FIG. 4B.

Figure 6:
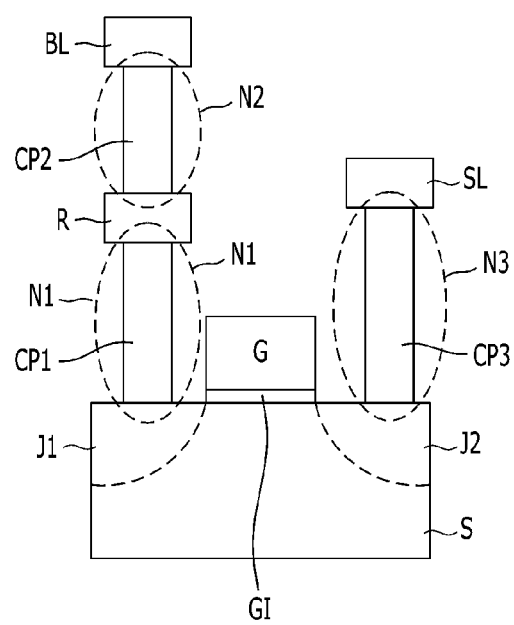
FIG. 6 is a diagram illustrating another example of a semiconductor device including an array including the memory cell of FIG. 1.

FIG. 6 is a diagram illustrating another example of a semiconductor device which includes an array including the memory cell of FIG. 1. The following descriptions will be focused on differences from the embodiment of FIGS. 4A to 5C.

Referring to FIG. 6, a transistor in accordance with the present implementation may include a planar type transistor having a gate electrode G positioned over a semiconductor substrate S. The gate electrode G may be insulated from the semiconductor substrate S by a gate dielectric layer GI. Inside the semiconductor substrate S at both sides of the gate electrode G, first and second junction regions J1 and J2 may be formed.

Over the first junction region J1, a stacked structure may be formed, which includes a first conductive plug CP1, a variable resistance element R, a second conductive plug CP2, and a bit line BL. Over the second junction region J2, a stacked structure may be formed, which includes a third conductive plug CP3 and a source line SL.

One or more barrier layers (not illustrated) may be formed at one or more of regions each corresponding to any of the first to third nodes N1 to N3. That is, the barrier layer may be positioned at one or more positions including the inside of the first conductive plug CP1, the top and bottom interfaces of the first conductive plug CP1, the inside of the second conductive plug CP2, the top and bottom interfaces of the second conductive plug CP2, the inside of the third conductive plug CP3, and/or the top and bottom interfaces of the third conductive plug CP3.

In accordance with the implementation, the electronic device can secure a read margin even though the variable resistance element has a small resistance difference.

The above and other memory circuits or semiconductor devices based on the disclosed technology can be used in a range of devices or systems. FIGS. 7-11 provide some examples of devices or systems that can implement the memory circuits disclosed herein.

Figure 7:
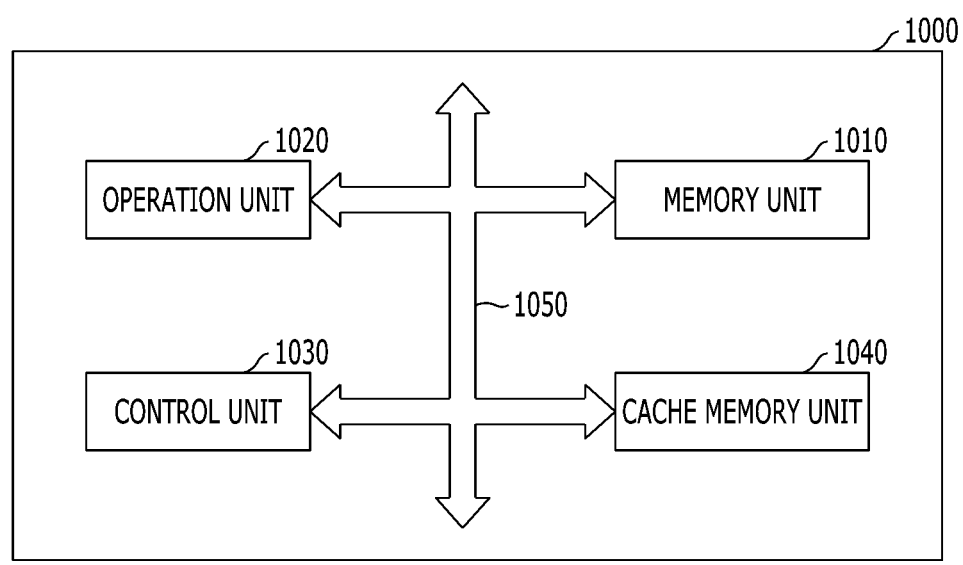
FIG. 7 is an example of configuration diagram of a microprocessor implementing memory circuitry based on the disclosed technology.

FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a selecting element; a variable resistance element electrically coupled to the selecting element through a first conductive plug; a first line electrically coupled to the variable resistance element through a second conductive plug; a second line electrically coupled to the selecting element through a third conductive plug; and one or more barrier layers arranged to form one or more electrical connections with the variable resistance element or the selecting element or the both and operated as an insulator or conductor according to a resistance state of the variable resistance element during a read operation. Through this, read margin of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
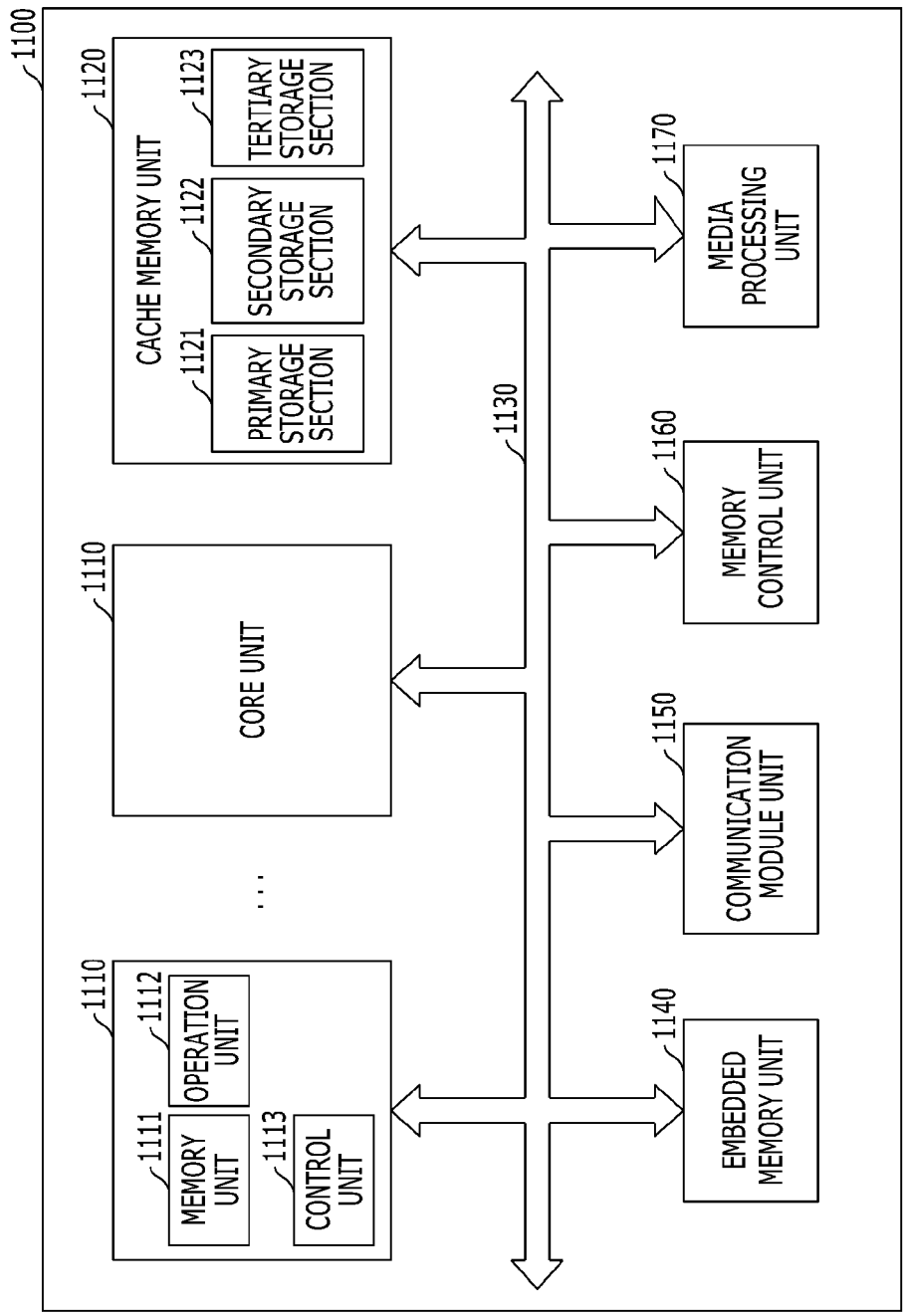
FIG. 8 is an example of configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a selecting element; a variable resistance element electrically coupled to the selecting element through a first conductive plug; a first line electrically coupled to the variable resistance element through a second conductive plug; a second line electrically coupled to the selecting element through a third conductive plug; and one or more barrier layers arranged to form one or more electrical connections with the variable resistance element or the selecting element or the both and operated as an insulator or conductor according to a resistance state of the variable resistance element during a read operation. Through this, read margin of the cache memory unit 1120 may be improved. As a consequence, operating characteristics of the processor 1100 may be improved.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
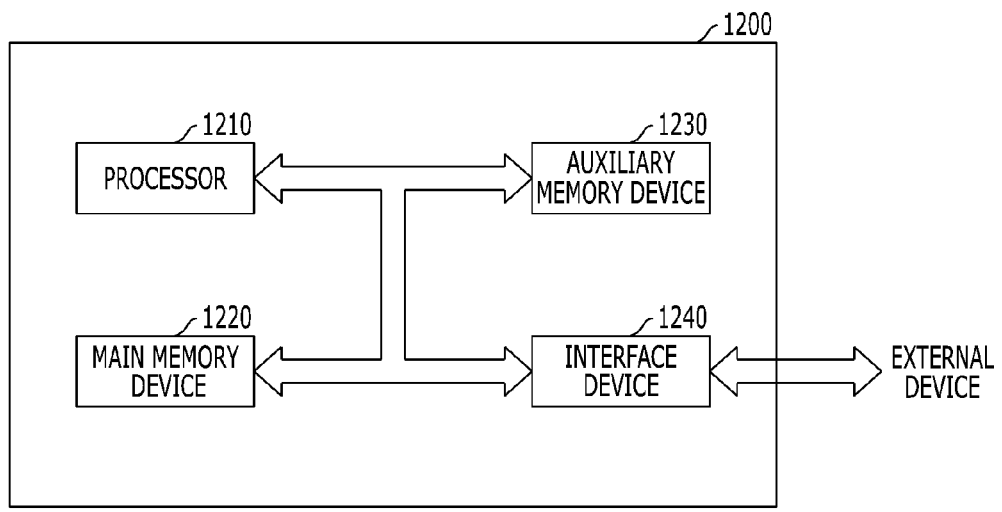
FIG. 9 is an example of configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a selecting element; a variable resistance element electrically coupled to the selecting element through a first conductive plug; a first line electrically coupled to the variable resistance element through a second conductive plug; a second line electrically coupled to the selecting element through a third conductive plug; and one or more barrier layers arranged to form one or more electrical connections with the variable resistance element or the selecting element or the both and operated as an insulator or conductor according to a resistance state of the variable resistance element during a read operation. Through this, read margin of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a selecting element; a variable resistance element electrically coupled to the selecting element through a first conductive plug; a first line electrically coupled to the variable resistance element through a second conductive plug; a second line electrically coupled to the selecting element through a third conductive plug; and one or more barrier layers arranged to form one or more electrical connections with the variable resistance element or the selecting element or the both and operated as an insulator or conductor according to a resistance state of the variable resistance element during a read operation. Through this, read margin of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
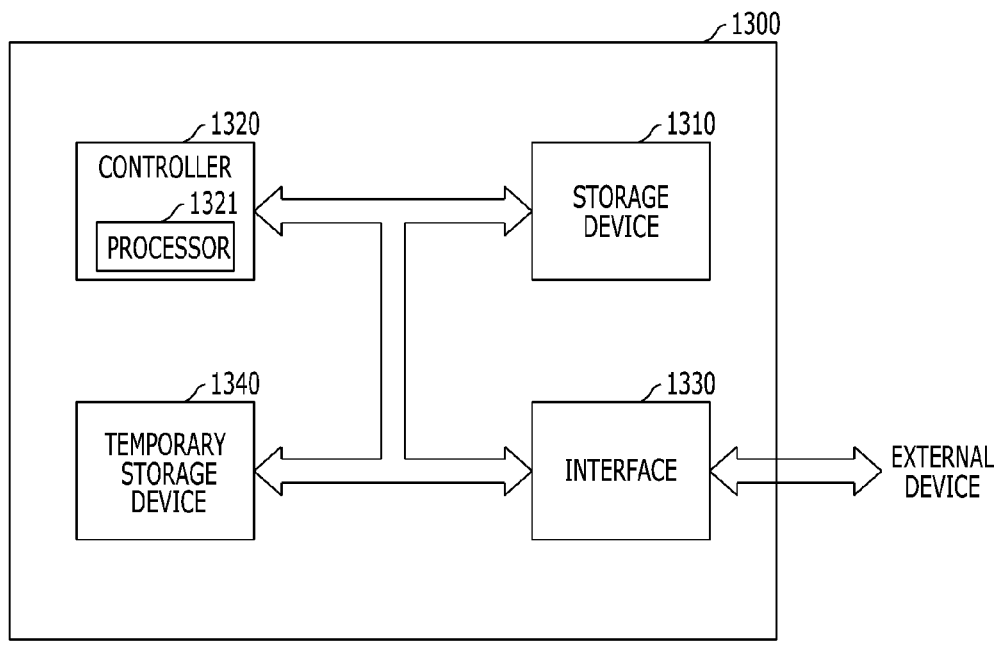
FIG. 10 is an example of configuration diagram of a data storage system implementing memory circuitry based on the disclosed technology.

FIG. 10 is an example of configuration diagram of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a selecting element; a variable resistance element electrically coupled to the selecting element through a first conductive plug; a first line electrically coupled to the variable resistance element through a second conductive plug; a second line electrically coupled to the selecting element through a third conductive plug; and one or more barrier layers arranged to form one or more electrical connections with the variable resistance element or the selecting element or the both and operated as an insulator or conductor according to a resistance state of the variable resistance element during a read operation. Through this, read margin of the storage device 1310 or the temporary storage device 1340 may be improved. As a consequence, operating characteristics and data storage characteristics of the data storage system 1300 may be improved.

Figure 11:
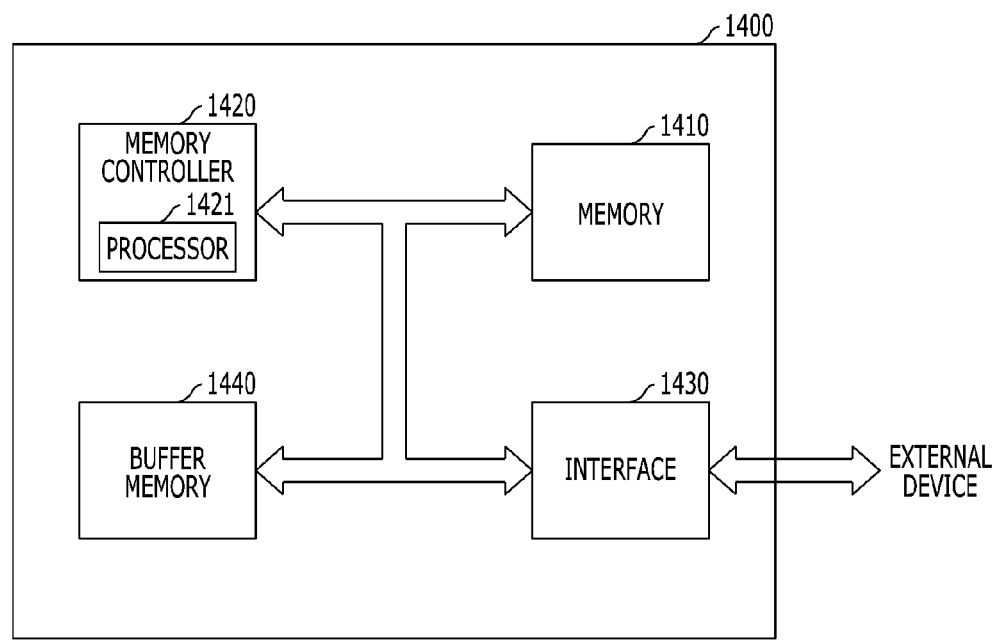
FIG. 11 is an example of configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a selecting element; a variable resistance element electrically coupled to the selecting element through a first conductive plug; a first line electrically coupled to the variable resistance element through a second conductive plug; a second line electrically coupled to the selecting element through a third conductive plug; and one or more barrier layers arranged to form one or more electrical connections with the variable resistance element or the selecting element or the both and operated as an insulator or conductor according to a resistance state of the variable resistance element during a read operation. Through this, read margin characteristics of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a selecting element; a variable resistance element electrically coupled to the selecting element through a first conductive plug; a first line electrically coupled to the variable resistance element through a second conductive plug; a second line electrically coupled to the selecting element through a third conductive plug; and one or more barrier layers arranged to form one or more electrical connections with the variable resistance element or the selecting element or the both and operated as an insulator or conductor according to a resistance state of the variable resistance element during a read operation. Through this, read margin of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory,
    wherein the semiconductor memory comprises:
    a selecting element;
    a variable resistance element electrically coupled to the selecting element through a first conductive plug;
    a first line electrically coupled to the variable resistance element through a second conductive plug;
    a second line electrically coupled to the selecting element through a third conductive plug; and
    one or more barrier layers arranged to form one or more electrical connections with the variable resistance element or the selecting element or the both and operated as an insulator or conductor according to a resistance state of the variable resistance element during a read operation.

2. The electronic device of claim 1, wherein the one or more connections are formed at one or more locations including an interface between the first conductive plug and the selecting element, an inside of the first conductive plug, an interface between the first conductive plug and the variable resistance element, an interface between the second conductive plug and the variable resistance element, an inside of the second conductive plug, an interface between the second conductive plug and the first line, an interface between the third conductive plug and the selecting element, an inside of the third conductive plug, or an interface between the third conductive plug and the second line.

3. The electronic device of claim 1, wherein when the variable resistance element has a high resistance state, the one or more barrier layers function as an insulator, and
when the variable resistance element has a low resistance state, the one or more barrier layers function as a conductor.

4. The electronic device of claim 1, wherein the one or more barrier layers have a single-layer structure or multi-layer structure including an OTS (Ovonic Threshold Switching) material, an MIEC (Mixed Ionic Electronic Conducting) material, an MIT (Metal Insulator Transition) material, a tunneling insulator, or a semiconductor material.

5. The electronic device of claim 1, wherein the one or more barrier layers in contact with the first conductive plug has a width equal to or greater than a width of the first conductive plug while overlapping the first conductive plug.

6. The electronic device of claim 1, wherein the one or more barrier layers in contact with the second conductive plug has a width equal to or greater than a width of the second conductive plug while overlapping the second conductive plug.

7. The electronic device of claim 1, wherein the one or more barrier layers in contact with the third conductive plug has a width equal to or greater than a width of the third conductive plug while overlapping the third conductive plug.

8. The electronic device of claim 1, wherein the variable resistance element has a structure in which a tunnel barrier layer is interposed between two magnetic layers.

9. The electronic device of claim 1, wherein the selecting element includes a transistor having a gate electrode, a first junction region positioned at one side of the gate electrode and coupled to the first conductive plug, and a second junction region positioned at the other side of the gate electrode and coupled to the third conductive plug.

10. The electronic device of claim 1, wherein the one or more barrier layer have a sidewall aligned with sidewalls of one or more of the first to third conductive plugs.

11. The electronic device of claim 1, wherein the one or more barrier layers have a sidewall aligned with a sidewall of the variable resistance element.

12. The electronic device of claim 1, wherein the one or more barrier layers have a sidewall aligned with sidewalls of one or more of the first and second lines.

13. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory is part of the cache memory unit in the processor.

14. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory is part of the auxiliary memory device or the main memory device in the processing system.

15. The electronic device according to claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

16. An electronic device comprising a semiconductor memory,
wherein the semiconductor memory comprises:
a memory cell including a variable resistance element and a selecting element coupled to the variable resistance element;
a first line coupled to the variable resistance element of the memory cell;
a second line coupled to the selecting element of the memory cell; and
one or more barrier elements coupled to the selecting element or the variable resistance element or the both and configured to increase a read margin of the memory cell as compared to a memory cell with no barrier element during a read operation, and
wherein the one or more barrier elements are positioned at one or more locations including a portion from the variable resistance element to the selecting element, a portion from the variable resistance element to the first line, or a portion from the selecting element to the second line, and the one or more barrier elements are configured to be selectively turned on or off according to a resistance state of the variable resistance element.

17. An electronic device comprising a semiconductor memory,
wherein the semiconductor memory comprises:
a memory cell including a variable resistance element and a selecting element coupled to the variable resistance element;
a first line coupled to the variable resistance element of the memory cell;
a second line coupled to the selecting element of the memory cell; and
one or more barrier elements coupled to the selecting element or the variable resistance element or the both and configured to increase a read margin of the memory cell as compared to a memory cell with no barrier element during a read operation, and wherein when the variable resistance element has a high resistance state, the one or more barrier elements are turned off, and when the variable resistance element has a low resistance state, the one or more barrier elements are turned on.

18. The electronic device of claim 17, wherein the variable resistance element includes an MTJ (Magnetic Tunnel Junction) element.

19. The electronic device of claim 17, wherein the one or more barrier elements include an OTS material, an MIEC material, an MIT material, a tunneling insulator, or a semiconductor material.

* * * * *